United States Patent [19]
Sunkavalli

[11] Patent Number: 6,141,255
[45] Date of Patent: Oct. 31, 2000

[54] 1 TRANSISTOR CELL FOR EEPROM APPLICATION

[75] Inventor: Ravi Sunkavalli, Santa Clara, Calif.

[73] Assignee: Advanced Micro Devices, Inc., Sunnyvale, Calif.

[21] Appl. No.: 09/389,161

[22] Filed: Sep. 2, 1999

[51] Int. Cl.[7] .................................................. G11C 16/04
[52] U.S. Cl. ..................................... 365/185.29; 365/218
[58] Field of Search .............................. 365/185.29, 218, 365/185.23, 185.26, 185.3

[56] References Cited

U.S. PATENT DOCUMENTS

| | | | |
|---|---|---|---|
| Re. 36,210 | 5/1999 | Santin | 365/185.19 |
| 5,047,981 | 9/1991 | Gill et al. | 365/185 |
| 5,177,705 | 1/1993 | McElroy et al. | 365/185 |
| 5,267,209 | 11/1993 | Yoshida | 365/218 |
| 5,412,603 | 5/1995 | Schreck et al. | 365/189.01 |
| 5,467,307 | 11/1995 | D'Arrigo et al. | 365/185.06 |
| 5,471,428 | 11/1995 | Barani et al. | 365/201 |
| 5,646,890 | 7/1997 | Lee et al. | 365/185.11 |

Primary Examiner—Richard Elms
Assistant Examiner—Anh Phung
Attorney, Agent, or Firm—H. Donald Nelson

[57] ABSTRACT

Memory devices having 1-transistor flash memory cells that in one embodiment allows bit-by-bit erase and in other embodiments allows erase of a multi-bit word. The word can be 8 bits, 16 bits, 32 bits, 64 bits or any size word. The memory devices have source bitlines that are connected to the bitline driver that controls the bitlines. The bitline driver and a wordline driver controls the voltages applied to selected bitlines, source bitlines while the wordline driver controls the voltage applied to selected wordlines to allow selected memory cells to be programmed, erased, or read.

8 Claims, 8 Drawing Sheets

1 TRANSISTOR CELL FOR EEPROM APPLICATION

BACKGROUND OF THE INVENTION

1. Field of the Invention

This invention relates generally to the art of microelectronic electronic circuits. More specifically, this invention relates to the architecture of flash memory devices. Even more specifically, this invention relates to the architecture of flash memory devices that utilize 1-transistor memory cells that allow the erasure of a bit or byte or word.

2. Discussion of the Related Art

A microelectronic flash or block erase Electrically Erasable Programmable Read-Only Memory (Flash EEPROM) includes an array of cells that can be independently programmed and read. The size of each cell and thereby the memory are made small by omitting transistors known as select transistors that enable the cells to be erased independently. As a result, all of the cells are erased together as a block.

A memory of this type includes individual Metal-Oxide-Semiconductor (MOS) field effect transistor memory cells, each of which includes a source, a drain, a floating gate and a control gate to which various voltages are applied to program the cell with a binary 1 or 0, or to erase all of the cells as a block.

The cells are connected in an array of rows and columns, with the control gates of the cells in a row being connected to a respective wordline and the drains of the cells in a column being connected to a respective bitline. The sources of the cells are connected together. This arrangement is known as a NOR memory configuration.

A cell is programmed by applying a voltage, typically 9 volts to the control gate, applying a voltage of approximately 5 volts to the drain and grounding the source, which causes hot electrons to be injected from a drain depletion region into the floating gate. Upon removal of the programming voltages, the injected electrons are trapped in the floating gate and create a negative change therein which increases the threshold voltage of the cell to a value in excess of approximately 4 volts.

A cell is read by applying typically 5 volts to the control gate, applying 1 volt to the bitline to which the drain is connected, grounding the source, and sensing the bitline current. If the cell is programmed and the threshold voltage is relatively high (4 volts), the bitline current will be zero or at least relatively low. If the cell is not programmed or erased, the threshold voltage will be relatively low (2 volts), the control gate voltage will enhance the channel, and the bitline current will be relatively high.

A cell can be erased in several ways. In one arrangement, a cell is erased by applying a relatively high voltage, typically 12 volts, to the source, grounding the control gate and allowing the drain to float. This causes the electrons that were injected into the floating gate during programming to undergo Fowler-Nordheim tunneling from the floating gate through the thin tunnel oxide layer to the source. A cell can also be erased by applying a negative voltage on the order of −10 volts to the control gate, applying 5 volts to the source and allowing the drain to float. Another method of erasing is by applying 5V to the P-well and −10V to the control gate while allowing the source/drain to float.

The erase procedure causes electron trapping to occur in the tunnel oxide. In addition, the undererase and overerase procedures cause electron trapping to occur in the tunnel oxide. Although each programming/erase cycle adds only a small number of electron trapping, the cumulative electron trapping increases as each programming/erase cycle is completed which, in turn, increasingly degrades the erase time.

Because prior art flash memory devices must be erased as a block, it is necessary to erase the entire memory device if only one memory cell must be changed from a programmed state to an unprogrammed state. Each time the memory device is erased, the cumulative electron trapping increases as each erase/programming cycle is completed and, as discussed above, the operation of the memory cell is degraded.

Therefore, what is needed are memory devices made up of 1 transistor memory cells that allow the memory devices to be erased one bit at a time, one byte at a time or 1 word at a time.

SUMMARY OF THE INVENTION

According to the present invention, the foregoing and other objects and advantages are obtained by memory devices having 1-transistor flash memory cells.

In accordance with one aspect of the invention, a memory device having 1-transistor memory cells that allow bit-by-bit erase of selected memory cells have the memory cells arranged in an array of rows and columns with the control gates connected to a wordline, the drains connected to a bitline and the sources of memory cells in a column connected to a respective source bitline.

In accordance with another aspect of the invention, a bitline driver controls the bitlines and the source bitlines and a wordline driver controls the wordlines. A supply power supplies power to the bitline driver and the wordline driver. A controller controls the output of the power supply, the output of the bitline driver and the output of the wordline driver.

In accordance with another aspect of the invention, a memory device having 1-transistor memory cells that allow erase of a selected multi-bit word have the memory cells arranged in an array of rows and columns with the control gates connected to a wordline, the drains of cells in columns connected to bitlines and the sources of the multi-bit words connected to respective source connect lines and the source connect lines making up a column of multi-bit words connected to a source bitline.

In accordance with another aspect of the invention, a bitline driver controls the bitlines and the source bitlines and a wordline driver controls the wordlines. A supply power supplies power to the bitline driver and the wordline driver. A controller controls the output of the power supply, the output of the bitline driver and the output of the wordline driver.

In accordance with other aspect of the invention, the multi-bit word can have 8 bits, 16 bits, 32 bits or 64 bits.

The described devices thus provide flash memory devices that in one embodiment allows bit-by-bit erase of the memory device and in other embodiments allows erase of the device of multi-bit words.

The present invention is better understood upon consideration of the detailed description below, in conjunction with the accompanying drawings. As will become readily apparent to those skilled in the art from the following description, there is shown and described embodiments of this invention simply by way of illustration of the best mode to carry out the invention. As will be realized, the invention is capable of other embodiments and its several details are capable of modifications in various obvious aspects, all without departing from the scope of the invention. Accordingly, the drawings and detailed description will be regarded as illustrative in nature and not as restrictive.

BRIEF DESCRIPTION OF THE DRAWINGS

The novel features believed characteristic of the invention are set forth in the appended claims. The invention itself, however, as well as a preferred mode of use, and further objects and advantages thereof, will best be understood by reference to the following detailed description of illustrative embodiments when read in conjunction with the accompanying drawings, wherein:

DETAILED DESCRIPTION

Reference is now made in detail to specific embodiments of the present invention that illustrate the best mode presently contemplated by the inventors for practicing the invention.

Figure 1A:
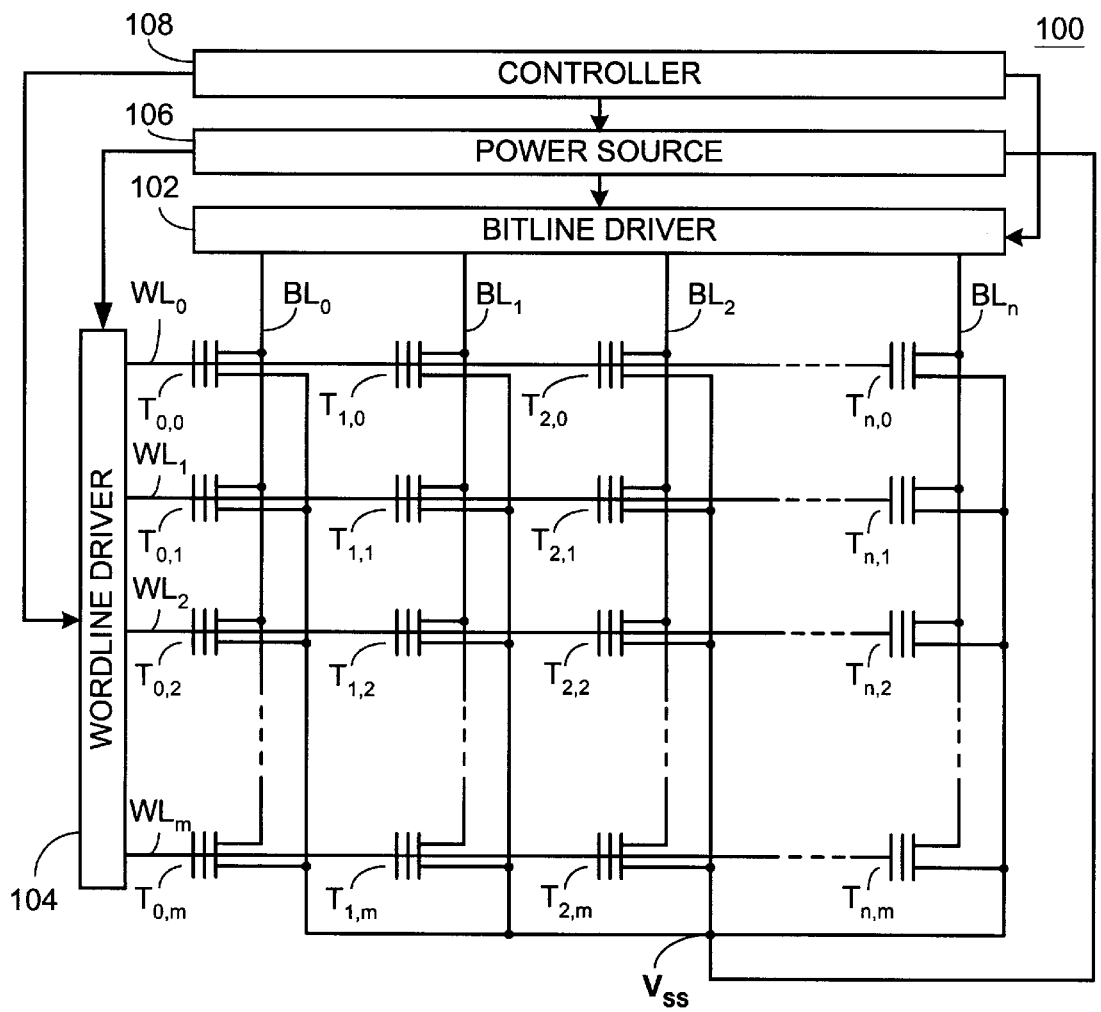
FIG. 1A is a simplified electrical schematic diagram of a prior art flash EEPROM.

FIG. 1A illustrates a basic configuration of a prior art NOR type flash Electrically Erasable Programmable Read-Only Memory (EEPROM) 100. The flash memory 100 comprises a plurality of core or memory cells, which are arranged in a rectangular matrix or array of rows and columns. Each row is associated with a wordline (WL), whereas each column is associated with a bitline (BL).

Assuming that there are n columns and m rows, the bitlines are designated as $BL_0$ to $BL_n$ and the wordlines are designated as $WL_0$ to $WL_m$. Bitline driver 102 applies appropriate voltages to the bitlines, whereas a wordline driver 104 applies appropriate voltages to the wordlines. The voltages applied by the drivers 102 and 104 are generated by a power source 106 under the control of a controller 108, which is typically on-chip logic circuitry. The controller 108 also controls the drivers 102 and 104 to address the memory cells individually or collectively as will be described below.

A memory cell is located at each junction of a wordline and a bitline. Each cell includes a Metal-Oxide-Semiconductor (MOS) Field Effect Transistor (FET) having a source and drain formed in a semiconductor substrate, a floating gate, and a control gate separated from the floating gate by a layer of oxide. As should be appreciated, the cells of a flash EEPROM differ from conventional FETs in that they include the floating gate and tunnel oxide layer disposed between the control gate and the semiconductor substrate in which the source and drain are formed.

The cells illustrated in FIG. 1A are designated using the notation $T_{n,m}$, where m is the row (wordline) number and n is the column (bitline) number. The control gates of the cells are connected to respective wordlines, and the drains of the cells are connected to respective bitlines as illustrated. The sources of all of the cells are connected to the power source 106.

Figure 1B:
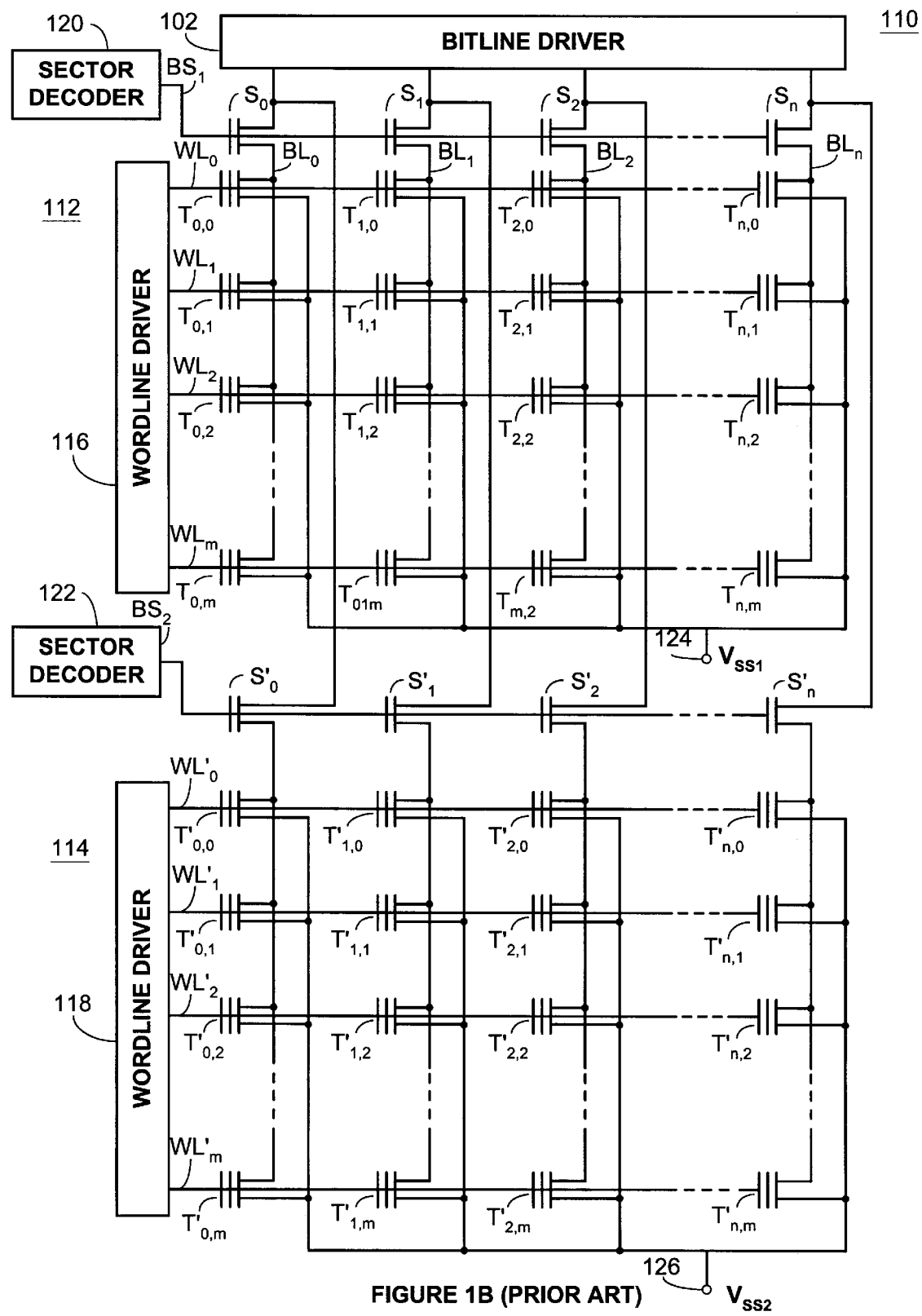
FIG. 1B is similar to FIG. 1A but illustrates a prior art flash EEPROM having cells arranged in two pages or banks.

FIG. 1B illustrates another flash EEPROM memory 110 which is similar to the memory 100 except that the cells are divided into a banks, (also known as pages or sectors), two of which are shown in FIG. 1B, each of which can be programmed, erased, and read independently. The memory 110 includes a first cell bank or page 112 and a second cell bank or page 114. The memory cells in the first bank 112 are designated in the same manner as in FIG. 1A, whereas a prime symbol is added to the designations of the cells in the second bank 114. The wordlines of the banks 112 and 114 are connected to separate wordline drivers 116 and 118, respectively.

In addition to the memory cells, each bank 112 and 114 includes a select transistor for each bitline. The select transistors for the banks 112 and 114 are designated as $S_0$ to $S_n$ and $S'_0$ to $S'_n$, respectively. The drains of the select transistors are connected to the respective bitlines, whereas the sources of the select transistors are connected to the drains of the transistors for the wordlines $WL_0$ to $WL_m$ and $WL'_0$ to $WL'_m$.

The select transistors differ from the memory cell transistors in that they are conventional MOSFETs and therefore lack floating gates. The select transistors are switching elements rather than memory elements. The gates of the select transistors for the bank 112 are connected to a bank select $BS_1$ of a sector decoder 120 and the gates of the select transistors for the bank 114 are connected to a bank select output $BS_2$ of a sector decoder 122.

The sources of the cells in bank 112 are connected to a common source supply voltage $V_{ss1}$ 124 and the sources of the cells in the bank 114 are connected to a common source supply voltage $V_{ss2}$ 126.

The bank 112 is selected by applying a logically high signal to the bank select line $BS_1$ that turns on the transistors $S_0$ to $S_n$ and connects the bitlines $BL_0$ to $BL_n$ to the underlying memory cells. The bank 112 is deselected by applying a logically low signal to the bank select line $BS_1$ that turns off the transistors $S_0$ to $S_n$ and disconnects the memory cells from the bitlines. The bank 114 is selected and deselected in an essentially similar manner using the bank select signal $BS_2$ and select transistors $S'_0$ to $S'_n$. The operation of the memory 110 is essentially similar to that of the memory 100 (FIG. 1A), except that the program, erase and read operations can be performed on the banks 112 & 114 independently.

Figure 2:
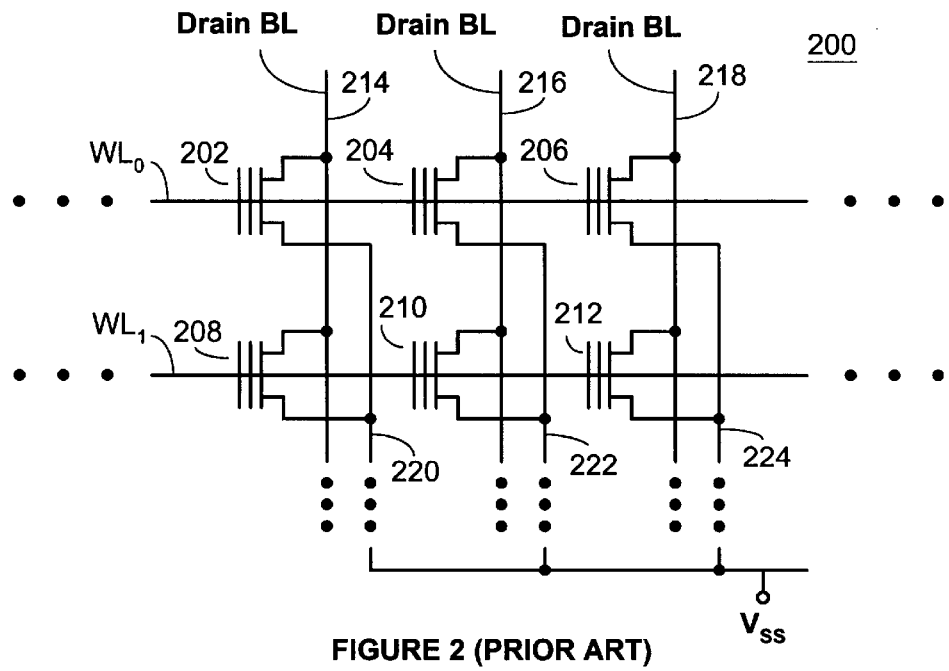
FIG. 2 shows six memory cells and the connections to the control gates, sources and drains of the six memory cells as in the prior art.

FIG. 2 is a detailed schematic of a portion 200 of a memory device showing six 1-transistor flash memory cells 202, 204, 206, 208, 210, and 212 and the electrical connections to the control gates, sources and drains of the six memory cells as in the prior art. The six memory cells 202, 204, 206, 208, 210, and 212 are arranged in two rows and 3 columns and as can be appreciated there are other memory cells that are not shown. The control gates of memory cells 202, 204 and 206 are connected to wordline $WL_0$ and the control gates of memory cells 208, 210 and 212 are connected to wordline $WL_1$. As discussed above in conjunction with FIG. 1A the wordlines $WL_0$ and $WL_1$ are connected to wordline driver 104 (FIG. 1A). The drains of memory cells 202 and 208 are connected to drain bitline 214, the drains of memory cells 204 and 210 are connected to drain bitline 216 and the drains of memory cells 206 and 208 are connected to drain bitline 218. The sources of memory cells 202 and 208 are connected to source line 220, the sources of memory cells 204 and 210 are connected to source line 222 and the sources of memory cells 206 and 212 are connected to source line 224. The source lines 220, 222, and 224 are all connected to $V_{SS}$, which is connected to the power source 106 (FIG. 1A). As can be appreciated all of the sources of the memory cells 202, 204, 206, 208, 210, and 212 are at the same electrical potential at any instant of time. As also can be appreciated, a specific memory cell can be selected by selecting a wordline and a bitline and the memory cell at the junction of the selected wordline and selected bitline is selected and electrical potentials can be applied to the control gate and to the drain of the selected memory cell that differ from the electrical potentials that are present at the control gates and drains of the unselected memory cells. However, because the sources of all the memory cells are connected to a common terminal, an electrical potential cannot be applied to the source of a specific memory cell that differs from the electrical potential that is present at the sources of the other memory cells. In addition, because cells are typically erased by applying a relatively high voltage to the source of the memory cell being erased, grounding the control gate and allowing the drain to float, the prior art configuration shown in FIG. 2 prevents the erasure of individual memory cells.

Figure 3:
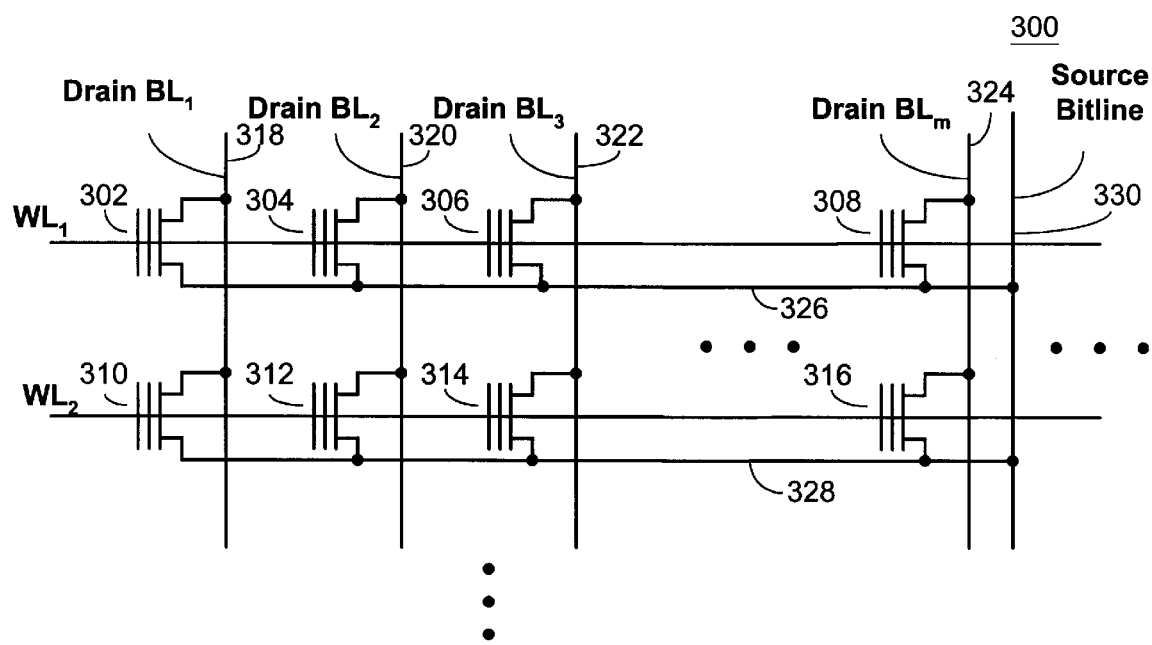
FIG. 3 shows a portion of a memory device showing the connections to the control gates, sources and drains of memory cells in the portion of the memory device in accordance with the present invention wherein multiple sources of memory cells in a row are connected to a source bitline.

FIG. 3 is a detailed schematic of a portion 300 of a memory device showing memory cells 302, 304, 306 and 308 with their control gates connected to $WL_1$ and memory cells 310, 312, 314 and 316 connected to $WL_2$. It should be appreciated that the memory cells 302, 304, 306 and 308 represent a "word" and that a word can be of arbitrary length, for example, a word can be 4 bits, 8 bits, 16 bits, 32 bits or longer or have any length. The drains of memory cells 302 and 310 are connected to drain bitline 318, the drains of memory cells 304 and 312 are connected to drain bitline 320 and the drains of memory cells 306 and 314 are connected to drain bitline 322 and the drains of memory cells 308 and 316 are connected to drain bitline 324. The sources of memory cells 302, 304, 306, and 308 are connected to the common source line 326. It should be appreciated that the sources of any memory cells between memory cell 306 and 308 would also be connected to the common source line 326. Similarly, the sources of memory cells 310, 312, 314 and 316 are connected to the common source line 328. The sources of any memory cells between memory cell 314 and 316 would also be connected to the common source line 328. The common source line 326 and 328 are connected to the source bitline 330. The source bitline is connected to the bitline driver 102 (FIG. 1A) that would be modified to drive the source bitlines in accordance with the present invention. The modified bitline driver will be discussed below in conjunction with FIG. 5.

As can be appreciated, the memory cells 302, 304, 306 and 308 can be erased independently of other memory cells in the array such as memory cells 310, 312, 314 and 316 because a high voltage can be applied to the sources of the memory cells 302, 304, 306, and 308 and the voltages applied to the control gates and drains of the memory cells 302, 304, 306 and 308 differ from the voltages applied to the control gates and drains of the other memory cells (the unselected memory cells). Therefore, during the application of the erasure pulse to the memory cells 302, 304, 306, and 308, the states of the other (unselected) memory cells are unaffected.

Figure 4:
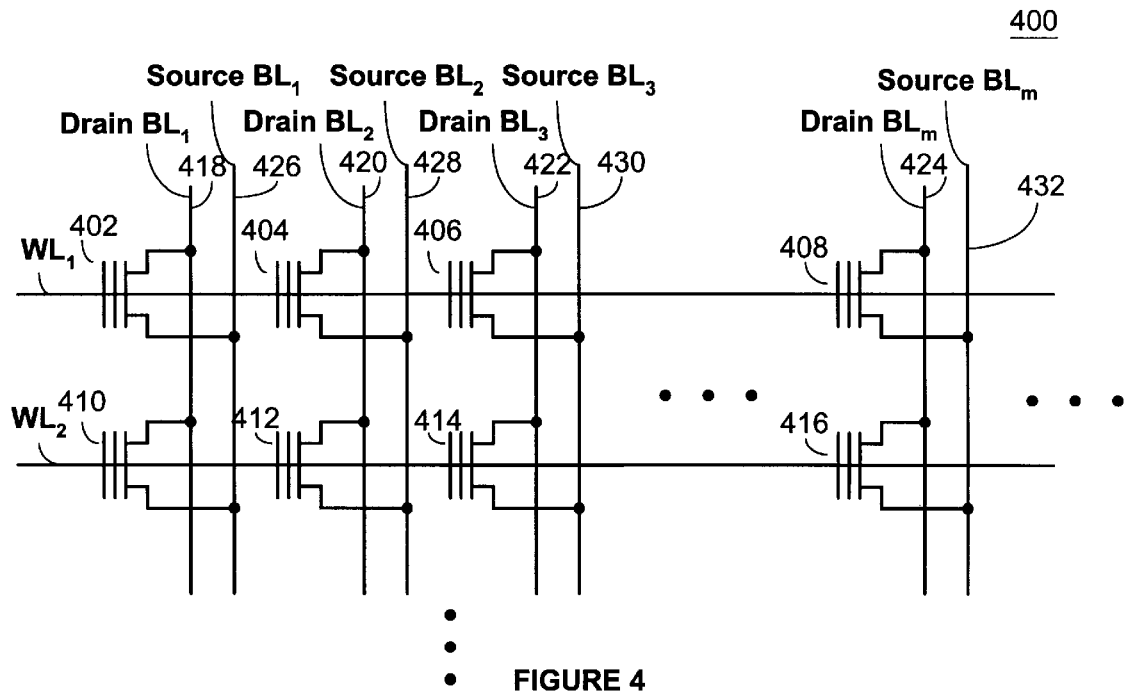
FIG. 4 shows a portion of a memory device similar to FIG. 3 showing the connections to the control gates, sources and drains of memory cells in the portion of the memory device in accordance with another embodiment of the present invention wherein each source of a memory cell in a row is connected to a separate source bitline.

FIG. 4 is a detailed schematic of a portion 400 of a memory device showing memory cells 402, 404, 406, and 408 with their control gates connected to $WL_1$ and memory cells 410, 412, 414, and 416 with their control gates connected to $WL_2$. It should be appreciated that the memory cells from 402 to 408 represent all of the memory cells connected to the $WL_1$. The drains of memory cells 402 and 410 are connected to drain bitline 418, the drains of memory cells 404 and 412 are connected to drain bitline 420, the drains of memory cells 406 and 414 are connected to drain bitline 422 and the drains of memory cells 408 and 416 are connected to drain bitline 424. The sources of memory cells 402 and 410 are connected to source bitline 426, the sources of memory cells 404 and 412 are connected to source bitline 428, the sources of memory cells 406 and 414 are connected to source bitline 430 and the sources of memory cells 408 and 416 are connected to source bitline 432. The source bitlines 426, 428, 430 and 432 are connected to the bitline driver 102 (FIG. 1A) that would be modified to drive the source bitlines in accordance with the present invention. The modified bitline driver will be discussed below in conjunction with FIG. 5.

Figure 5:
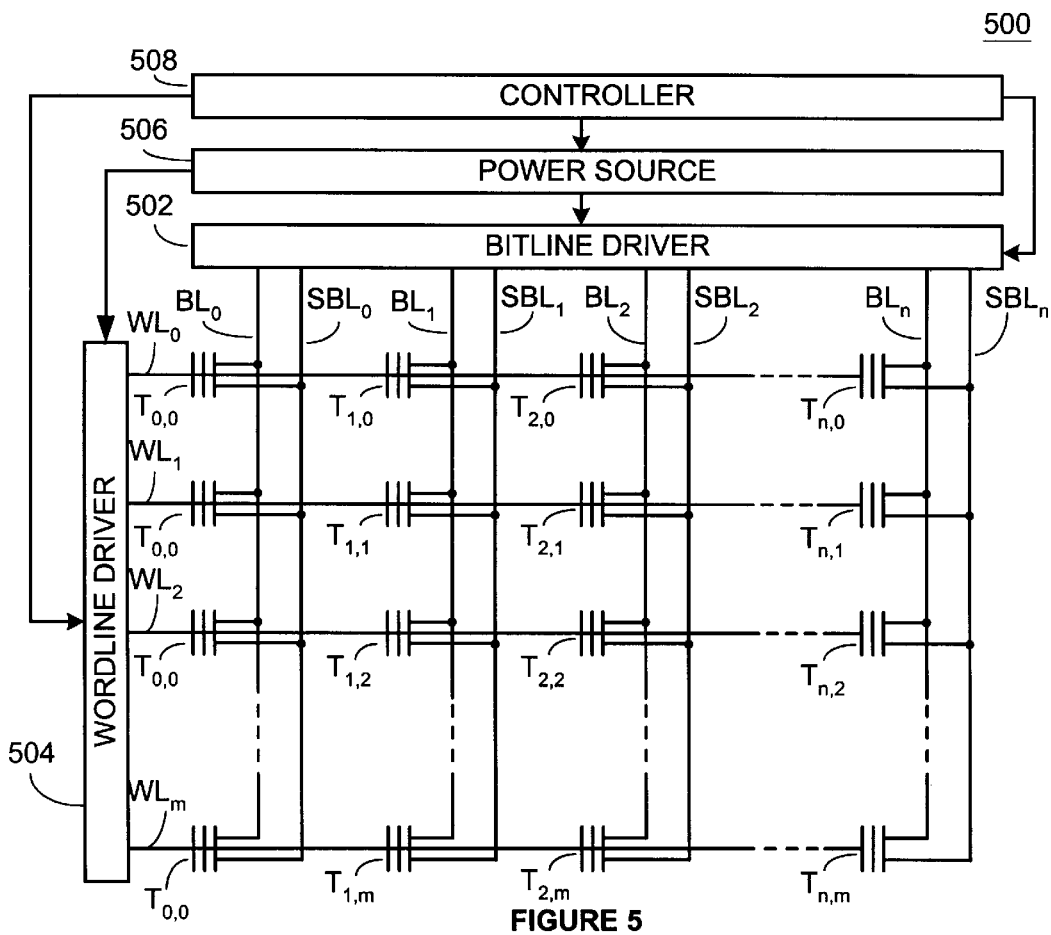
FIG. 5 is a simplified electrical schematic diagram of a flash EEPROM similar to FIG. 1A but showing the source of each memory cell in a row connected to a separate source bitline.

FIG. 5 illustrates a basic configuration of NOR type flash Electrically Erasable Programmable Read-Only Memory (EEPROM) configured with source bitlines for each memory cell on the wordline in accordance with the present invention. The flash memory 500 comprises a plurality of core or memory cells, which are arranged in a rectangular matrix or array of rows and columns. Each row is associated with a wordline (WL), whereas each column is associated with a bitline (BL). In addition, each column is also associated with a source bitline (SBL).

Assuming that there are n columns and m rows, the bitlines are designated as $BL_0$ to $BL_n$, the source bitlines are designated as $SBL_0$ to $SBL_n$ and the wordlines are designated as $WL_0$ to $WL_m$. Bitline driver 502 applies appropriate voltages to both the bitlines and the source bitlines, whereas a wordline driver 504 applies appropriate voltages to the wordlines. The voltages applied by the drivers 502 and 504 are generated by a power source 506 under the control of a controller 508, which is typically on-chip logic circuitry. The controller 508 also controls the drivers 502 and 504 to address the memory cells individually or collectively.

As in the prior art, a memory cell is located at each junction of a wordline and a bitline. Each cell includes a Metal-Oxide-Semiconductor (MOS) Field Effect Transistor (FET) having a source and drain formed in a semiconductor substrate, a floating gate, and a control gate separated from the floating gate by a layer of oxide. As should be appreciated, the cells of a flash EEPROM differ from conventional FETs in that they include the floating gate and tunnel oxide layer disposed between the control gate and the semiconductor substrate in which the source and drain are formed.

The cells illustrated in FIG. 5 are designated using the notation $T_{n,m}$, where m is the row (wordline) number n is the column (bitline) number. The control gates of the cells are connected to respective wordlines, and the drains of the cells are connected to respective bitlines as illustrated. The sources of the cells are connected to respective source bitlines as illustrated.

Figure 6:
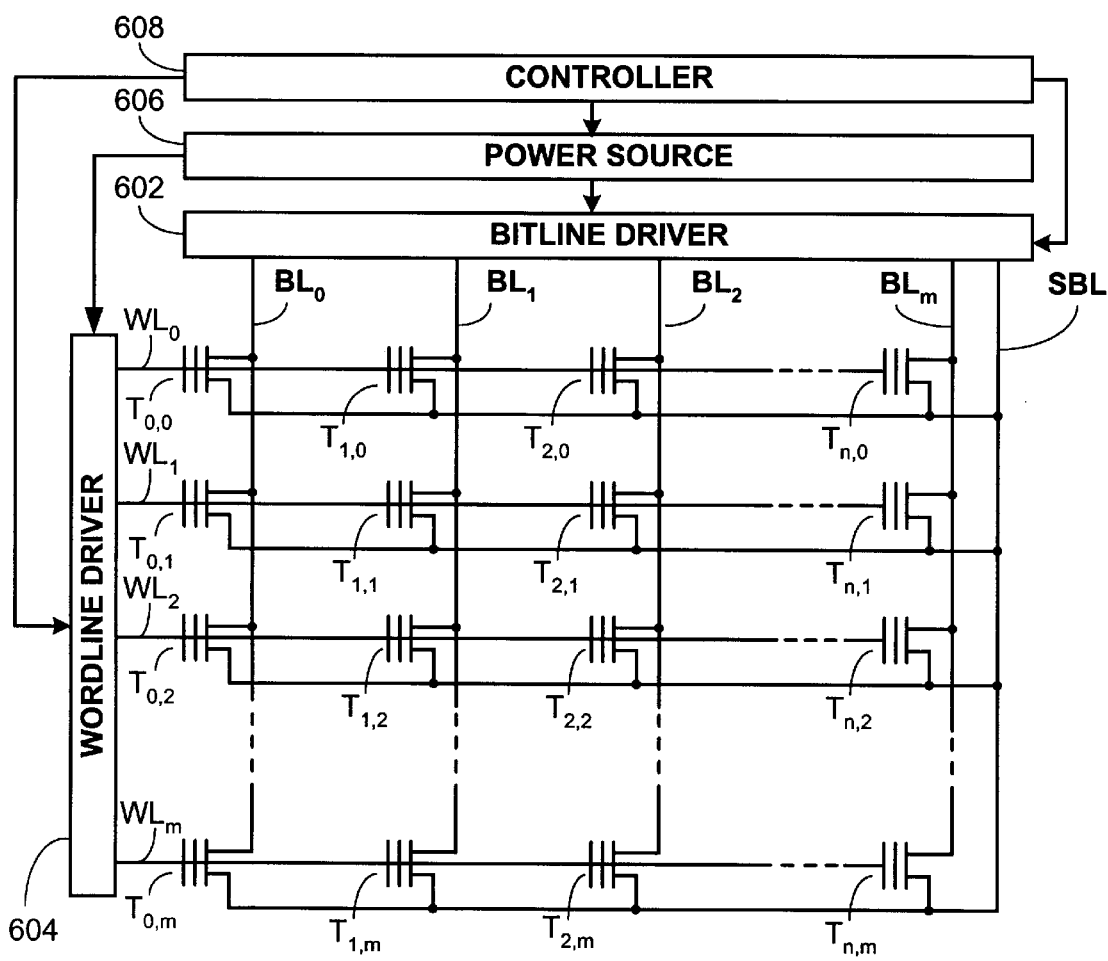
FIG. 6 is similar to FIG. 5 but showing the sources of multiple memory cells in a row connected to a source bitline.

FIG. 6 illustrates another basic configuration of NOR type flash Electrically Erasable Programmable Read-Only Memory (EEPROM) configured with sources of multiple memory cells connected to a source bitline in accordance with the present invention. The number of the multiple memory cells connected to a source bitline is a "word" that can have 8 bits, 16 bits, 32 bits or any other number of bits, higher or lower. The flash memory 600 comprises a plurality of core or memory cells, which are arranged in a rectangular matrix or array of rows and columns. Each row is associated with a wordline (WL), whereas each column is associated with bitline (BL). In addition, the sources of multiple memory cells in a row are connected to a source bitline.

Assuming that there are n columns and m rows, the bitlines are designated as $BL_0$ to $BL_n$ and the source bitlines are designated at SBL. Bitline driver 602 applies appropriate voltages to both the bitlines and the source bitlines, whereas a wordline driver 604 applies appropriate voltages to the wordlines. The voltages applied by the drivers 602 and 604 are generated by a power source 606 under the control of a controller 608, which is typically on-chip logic circuitry. The controller 608 also controls the drivers 602 and 604 to address the memory cells individually or collectively.

As in the prior art, a memory cell is located at each junction of a wordline and a bitline. Each cell includes a Metal-Oxide-Semiconductor (MOS) Field Effect Transistor (FET) having a source and drain formed in a semiconductor substrate, a floating gate, and a control gate separated from the floating gate by a layer of oxide. As should be appreciated, the cells of a flash EEPROM differ from conventional FETs in that they include the floating gate and tunnel oxide layer disposed between the control gate and the semiconductor substrate in which the source and drain are formed.

Figure 7:
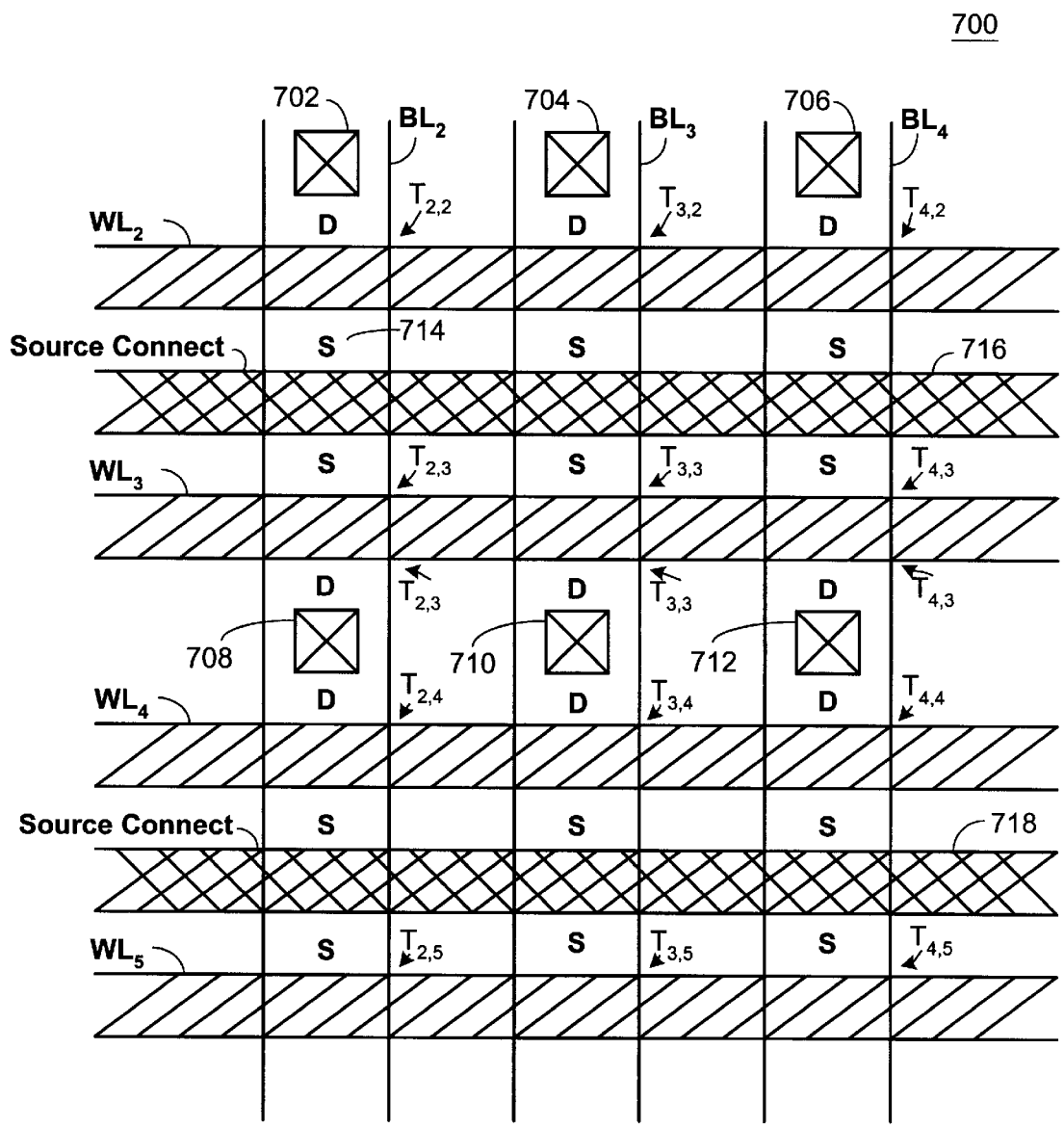
FIG. 7 shows the layout of a portion of a prior art memory device showing the sources of the memory cells connected to a common source line.

FIG. 7 shows the layout of a portion 700 of a prior art memory device showing the sources of the memory cells connected to a common source line. The portion 700 of the memory device illustrated shows four wordlines, $WL_2$ through $WL_5$, that intersect three bitlines, $BL_2$ through $BL_4$. As described above, at the intersections of the wordlines and bitlines there are formed transistors. The transistors are identified by the notation $T_{n,m}$, where m is the row (wordline) number and n is the column (bitline) number. For example, at the intersection of $WL_2$ and $BL_2$ there is formed a transistor designated $T_{2,2}$. There are shown drain contacts 702 through 712. A source region S is formed for each transistor, for example, the source region 714 is formed for the transistor $T_{2,2}$. The source connect line 716 connects the source regions of the transistors $T_{2,2}, T_{3,2}, T_{4,2}, T_{2,3}, T_{3,3}$ and $T_{4,2}$. Similarly, the source connect line 718 connects the source regions of the transistors $T_{2,4}, T_{3,4}, T_{4,4}, T_{2,5}, T_{3,5},$ and $T_{4,5}$. The source connect lines 716 and 718 have a common terminal that is connected to the power source 106 (FIG. 1A). As should be appreciated all of the sources in the prior art memory device of which the portion 700 is a part are connected to the common terminal that is connected to the power source 106.

Figure 8:
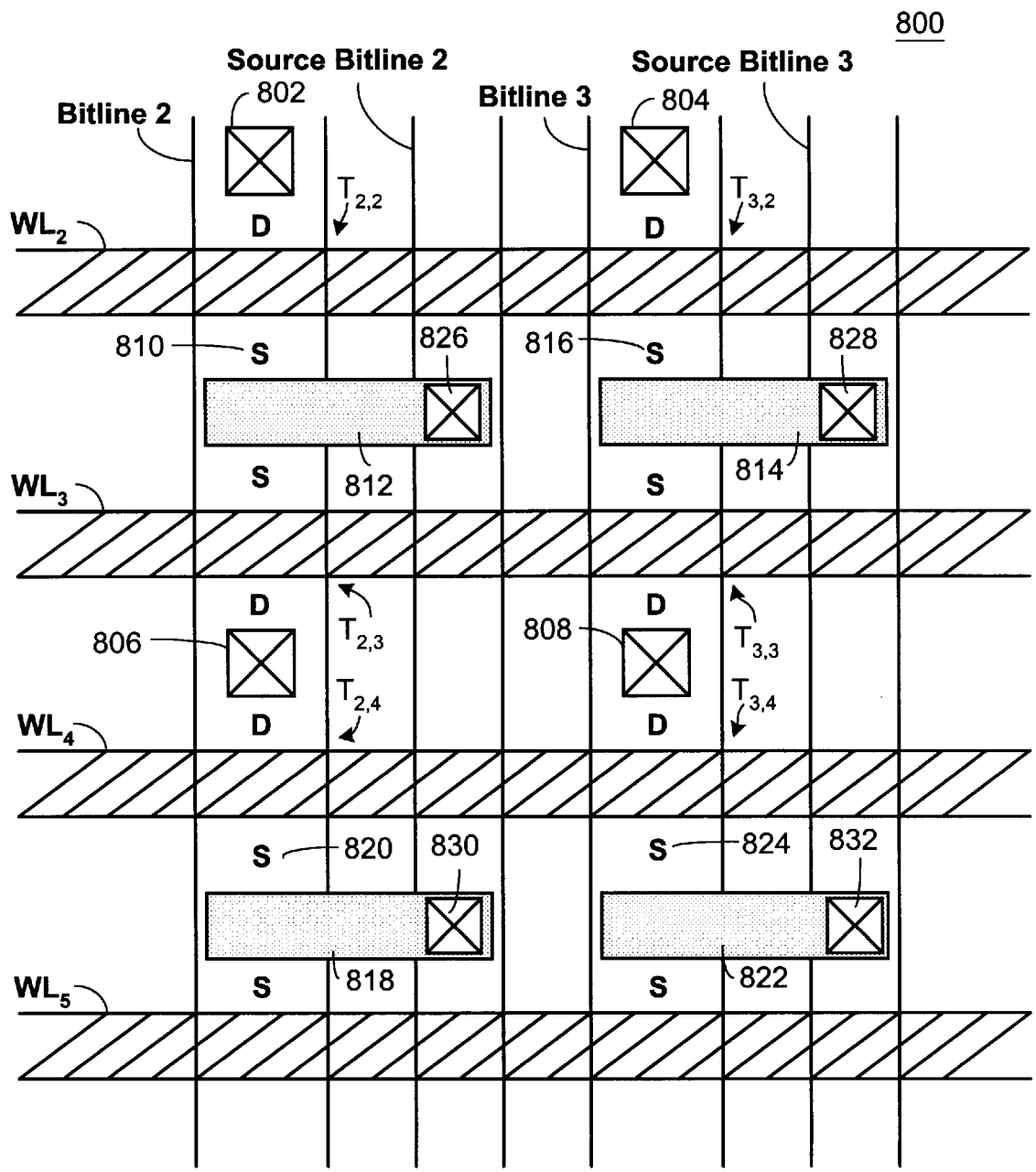
FIG. 8 shows the layout of a portion of a memory device showing the sources of memory cells in a row connected to a separate source bitlines.

FIG. 8 shows the layout of a portion 800 of a memory device showing the source of each memory cell in a column connected to a source bitline. The portion 800 of the memory device shows four wordlines, $WL_2$ through $WL_5$ that intersect two bitlines, $BL_2$ and $BL_3$. As described above, at the intersections of the wordlines and bitlines there are formed transistors. The transistors are identified by the notation $T_{n,m}$, where m is the row (wordline) number and n is the column (bitline) number. For example, at the intersection of $WL_2$ and Bitline 2 there is formed a transistor designated $T_{2,2}$. There are shown drain contacts 802, 804, 806, and 808. A source region S is formed for each transistor, for example, the source region 810 is formed for the transistor $T_{2,2}$. In addition, there are shown source bitlines 2 and 3. The source connect line 812 connects the source region 810 of transistor $T_{2,2}$ to source bitline 2. The source connect line 814 connects the source region 816 of transistor $T_{3,2}$ to source bitline 3. The source connect line 818 connects the source region 820 of transistor $T_{2,4}$ to source bitline 2. The source connect line 822 connects the source region 824 of transistor $T_{3,4}$ to the source bitline 3. The source connect lines 812, 814, 818, and 822 can be formed by any method known in the semiconductor manufacturing art, including an SAS (self-aligned source), diffusion, metal connects, and by the formation of local interconnects. All of these methods are well known in the semiconductor manufacturing art and will not be further discussed. There are shown source contacts 826, 828, 830 and 832. The source contacts serve to connect a structure in a first metal layer with a structure in a different metal layer. The bitlines and the source bitlines are connected to bitline driver 602, which controls the voltages applied to the bitlines and source bitlines. Because the source bitlines can be individually selected, as can the bitlines and wordlines, it is possible to select and program, read or erase individual memory cells. For example, by applying the appropriate voltages to $WL_2$, bitline 2, and source bitline 2, the transistor $T_{2,2}$ can be programmed, read or erased.

Figure 9:
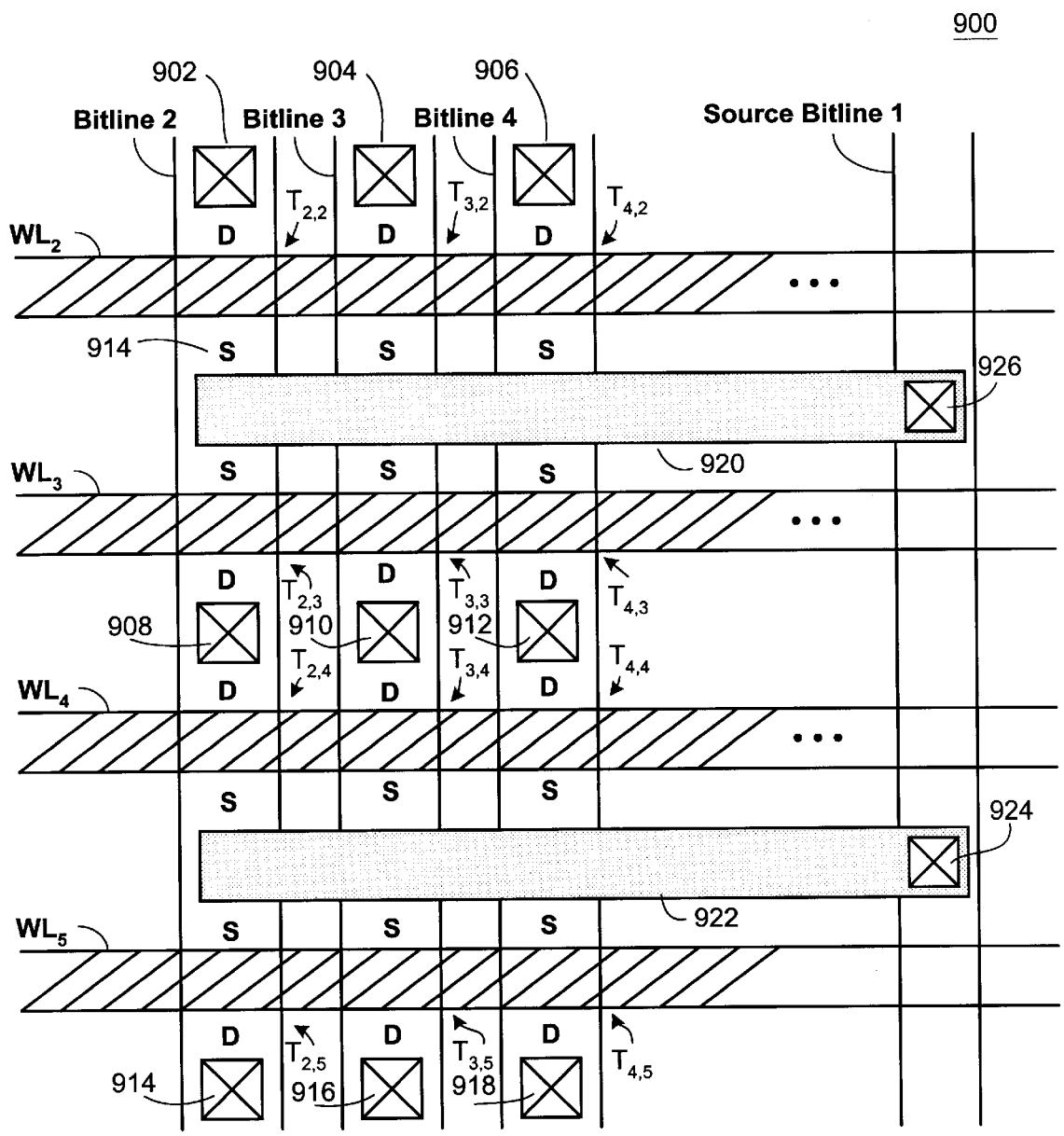
FIG. 9 shows the layout of a portion of a memory device showing the sources of memory cells in a row connected to a source bitline.

FIG. 9 shows the layout of a portion 900 of a memory device showing the sources of multiple memory cells in a row connected to a source bitline. The portion 900 of the memory device shows four wordlines, $WL_2$ through $WL_5$ that intersect three bitlines, Bitline 2 through Bitline 4. As described above, at the intersections of the wordlines and bitlines there are formed transistors. The transistors are identified by the notation $T_{n,m}$, where m is the row (wordline) number and n is the column (bitline) number. For example, at the intersection of $WL_2$ and Bitline 2 there is formed a transistor designated $T_{2,2}$. There are shown drain contacts 902, 904, 906, 908, 910, 912, 914, 916, and 918. A source region S is formed for each transistor, for example, the source region 914 is formed for the transistor $T_{2,2}$. The sources of transistors $T_{2,2}, T_{3,2}, T_{4,2}, T_{2,3}, T_{3,3},$ and $T_{4,3}$ are connected to source connect line 920 and the sources of transistors $T_{2,4}, T_{3,4}, T_{4,4}, T_{2,5}, T_{3,5},$ and $T_{4,5}$ are connected to source connect line 922. The source connect lines 920 and 922 are connected to source bitline 1 via source connects 924 and 926. The methods of forming the source connect lines 920 and 922 are discussed above in conjunction with FIG. 8. As is known in the semiconductor manufacturing art, the source connects 924 and 926 are structures, such as vias, that connect structures in one metal layer with structures in a different metal layer. The bitlines and the source bitline are connected to bitline driver 602 (FIG. 6), which controls the voltages applied to the bitlines and source bitline. It should be appreciated that there are shown only three intersections (therefore only three transistors) in wordline, however, there may be any number of transistors on the wordline having sources connected to the source connect lines 920 and 922. As discussed above, the number of transistors on the wordline having a common source can be a byte, a 16 bit word, a 32 bit word or any other number of transistors. Because the bitline driver can apply an appropriate voltage to a selected source bitline and to selected bitlines at the same time the wordline driver 604 (FIG. 6) applies an appropriate voltage to a selected wordline, the multiple transistors attached to the appropriate source connect line, such as source connect lines 920 and 922, can be erased without having to erase the entire memory device as in prior art devices.

In summary, the results and advantages of the memory devices can now be more fully realized. The described devices provide flash memory devices that in one embodiment allows bit-by-bit erase of the memory device and in other embodiments allows erase of the device of multi-bit words.

The foregoing description of the embodiments of the invention has been presented for purposes of illustration and description. It is not intended to be exhaustive or to limit the invention to the precise form disclosed. Obvious modifications or variations are possible in light of the above teachings. The embodiments were chosen and described to provide the best illustration of the principles of the invention and its practical application to thereby enable one of ordinary skill in the art to utilize the invention in various embodiments and with various modifications as are suited to the particular use contemplated. All such modifications and variations are within the scope of the invention as determined by the appended claims when interpreted in accordance with the breadth to which they are fairly, legally, and equitably entitled.

What is claimed is:

1. A memory device having 1-transistor memory cells that allow erase of selected multi-bit words, comprising:

multiple 1-transistor memory cells each having a drain, source, floating gate and control gate connected in an array of rows and columns with the control gates of the memory cells in a row connected to a respective wordline and the drains of cells in a column connected to a respective bitline;

sources of a selected number of memory cells in rows making up multi-bit words connected to source connect lines; and source bitlines connected to the source connect lines making up columns of multi-bit words having the selected number of bits.

2. The memory device of claim 1 further comprising:

a bitline driver, wherein the bitlines and source bitlines are connected to the bitline driver; and a wordline driver, wherein the wordlines are connected to the wordline driver.

3. The memory device of claim 2 further comprising a power source to supply power to the bitline driver and the wordline driver.

4. The memory device of claim 3 further comprising a controller to control the output of the power supply, the output of the bitline driver and the output of the wordline driver.

5. The memory device of claim 4 wherein the multi-bit word is a word having 4 bits.

6. The memory device of claim 4 wherein the multi-bit word is a word having 16 bits.

7. The memory device of claim 4 wherein the multi-bit word is a word having 32 bits.

8. The memory device of claim 4 wherein the multi-bit word is a word having 64 bits.

* * * * *